(12) United States Patent
Wan

(10) Patent No.: US 11,594,423 B2
(45) Date of Patent: Feb. 28, 2023

(54) FORMING METHOD OF CAPACITOR ARRAY AND SEMICONDUCTOR STRUCTURE

(71) Applicant: CHANGXIN MEMORY TECHNOLOGIES, INC., Hefei (CN)

(72) Inventor: Qiang Wan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/648,144

(22) Filed: Jan. 17, 2022

(65) Prior Publication Data

US 2023/0012790 A1    Jan. 19, 2023

Related U.S. Application Data

(63) Continuation of application No. PCT/CN2021/117449, filed on Sep. 9, 2021.

(30) Foreign Application Priority Data

Jul. 8, 2021 (CN) .......................... 202110772178.8

(51) Int. Cl.
*H01L 21/311* (2006.01)
*H01L 27/01* (2006.01)
*H01L 21/3105* (2006.01)

(52) U.S. Cl.
CPC ...... *H01L 21/31144* (2013.01); *H01L 27/016* (2013.01); *H01L 21/31053* (2013.01); *H01L 21/31116* (2013.01)

(58) Field of Classification Search
CPC ............. H01L 21/31144; H01L 27/016; H01L 21/31053; H01L 21/31116
See application file for complete search history.

(56) References Cited

U.S. PATENT DOCUMENTS 6,008,084 A * 12/1999 Sung ................. H01L 27/10844
                                                    257/E21.582
9,000,409 B2    4/2015 Huo et al.
(Continued)

FOREIGN PATENT DOCUMENTS

CN          102544049 A      7/2012
CN          108538835 A      9/2018
                    (Continued)

OTHER PUBLICATIONS

International Search Report cited in PCT/CN2021/117449 dated Apr. 8, 2022, 9 pages.
(Continued)

*Primary Examiner* — Monica D Harrison
*Assistant Examiner* — Andre C Stevenson
(74) *Attorney, Agent, or Firm* — Cooper Legal Group, LLC

(57) ABSTRACT

The present disclosure provides a method of forming a capacitor array and a semiconductor structure. The method of forming a capacitor array includes: providing a substrate, the substrate including an array region and a non-array region, wherein a base layer and a dielectric layer are formed in the substrate, and a first barrier layer is formed between the base layer and the dielectric layer; forming, on a surface of the dielectric layer, a first array definition layer and a second array definition layer respectively corresponding to the array region and the non-array region; forming a pattern transfer layer on a surface of each of the first array definition layer and the second array definition layer; patterning the dielectric layer and the second array definition layer by using the pattern transfer layer as a mask, and forming a capacitor array located in the array region.

16 Claims, 8 Drawing Sheets

(56) References Cited

U.S. PATENT DOCUMENTS

| | | | |
|---|---|---|---|
| 10,795,255 B2 | 10/2020 | Hsu et al. | |
| 2011/0248333 A1* | 10/2011 | Meotto | H01L 27/1052 |
| | | | 257/E21.004 |
| 2019/0341252 A1 | 11/2019 | Feng et al. | |

FOREIGN PATENT DOCUMENTS

| CN | 108933140 A | 12/2018 |
|---|---|---|
| CN | 110707044 A | 1/2020 |
| CN | 111029249 A | 4/2020 |
| CN | 112736035 A | 4/2021 |
| CN | 112750783 A | 5/2021 |

OTHER PUBLICATIONS

Written Opinion cited in PCT/CN2021/117449 dated Apr. 8, 2022, 9 pages.

* cited by examiner

FORMING METHOD OF CAPACITOR ARRAY AND SEMICONDUCTOR STRUCTURE

CROSS-REFERENCE TO RELATED APPLICATIONS

This is a continuation of International Application No. PCT/CN2021/117449, filed on Sep. 9, 2021, which claims the priority of Chinese Patent Application No. 202110772178.8, titled "FORMING METHOD OF CAPACITOR ARRAY AND SEMICONDUCTOR STRUCTURE" and filed on Jul. 8, 2021. The entire contents of International Application No. PCT/CN2021/117449 and Chinese Patent Application No. 202110772178.8 are incorporated herein by reference.

TECHNICAL FIELD

The present disclosure relates to the technical field of a manufacturing method of a semiconductor memory device, and in particular, to a forming method of a capacitor array and a semiconductor structure.

BACKGROUND

In the existing semiconductor structure manufacturing process, pattern transfer is mainly achieved by using self-aligned double patterning (SADP). However, in the pattern transfer process, due to limitations of the photolithography process, a defective redundant pattern is generated at a position of a capacitor array close to a peripheral circuit region, and a structural defect is further caused in the capacitor array formed on the basis of the redundant pattern, finally reducing a product yield.

SUMMARY

According to one aspect of embodiments of the present disclosure, a method of forming a capacitor array is provided, including: providing a substrate, the substrate including an array region and a non-array region, wherein a base layer and a dielectric layer are formed in the substrate, and a first barrier layer is formed between the base layer and the dielectric layer; forming, on a surface of the dielectric layer, a first array definition layer and a second array definition layer respectively corresponding to the array region and the non-array region; forming a pattern transfer layer on a surface of each of the first array definition layer and the second array definition layer; patterning the dielectric layer and the second array definition layer by using the pattern transfer layer as a mask, and forming a capacitor array located in the array region; and removing a remaining second array definition layer.

According to another aspect of the embodiments of the present disclosure, a semiconductor structure is provided, wherein a capacitor array of the semiconductor structure is formed by using the method of forming a capacitor array described in the foregoing implementation and provided in the present disclosure.

DETAILED DESCRIPTION

Figure 1:
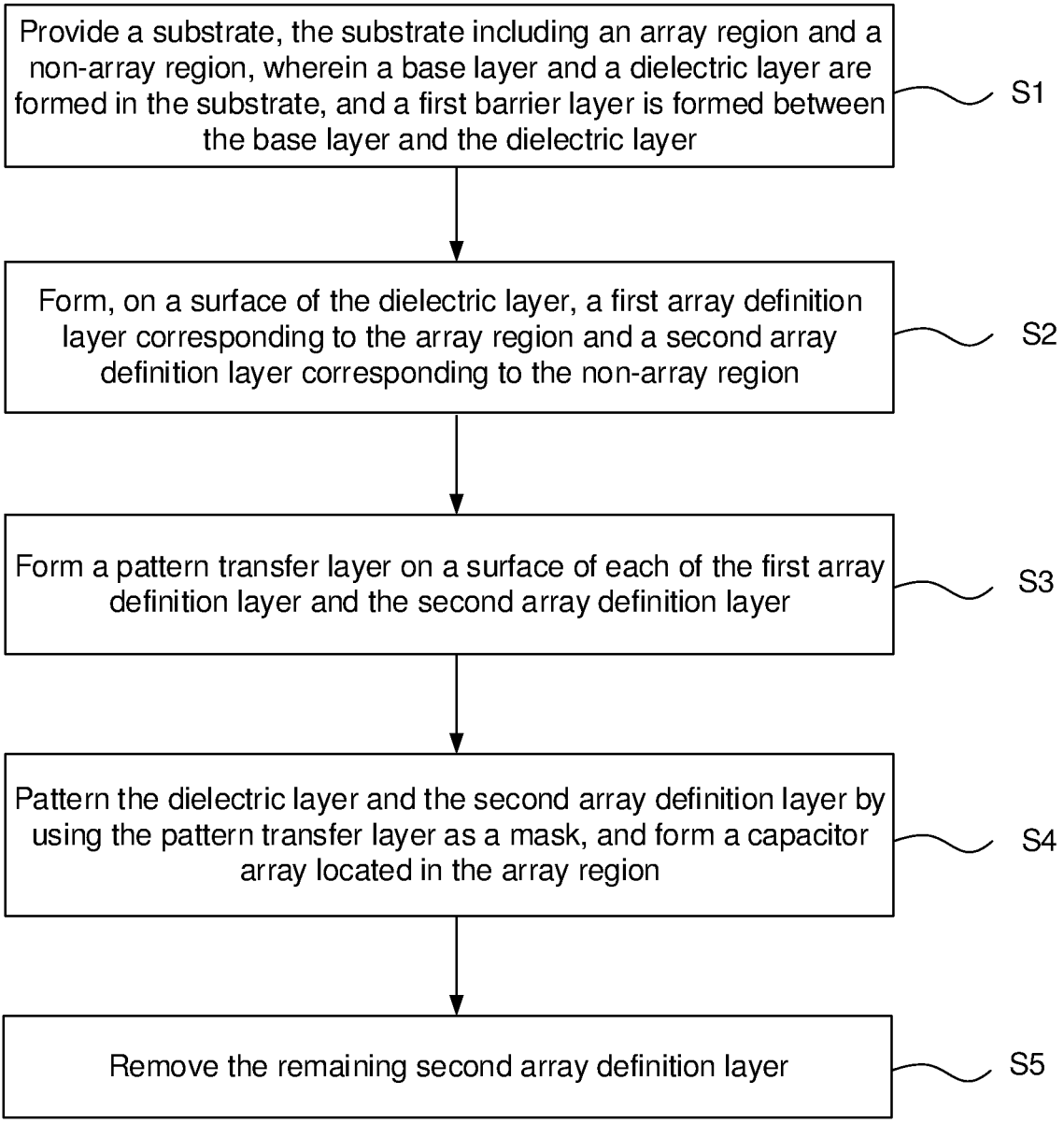
FIG. 1 is a schematic flowchart of a method of forming a capacitor array according to the present disclosure.

Exemplary embodiments will be described below more comprehensively with reference to the accompanying drawings. However, the exemplary embodiments can be implemented in a plurality of forms and should not be construed as being limited to embodiments described herein. On the contrary, these embodiments are provided such that the present disclosure is more comprehensive and complete, and fully conveys the concept of the exemplary embodiments to those skilled in the art. The same reference numerals in the figures indicate the same or similar structures, and thus their detailed descriptions will be omitted.

FIG. 1 representatively shows a schematic flowchart of a method of forming a capacitor array according to the present disclosure. In the exemplary implementation, the method of forming a capacitor array provided in the present disclosure is described by using an example of a manufacturing process in which a capacitor tube of a semiconductor structure is formed through a capacitor pattern transfer process of SADP. It is easily understandable for those skilled in the art that, in order to apply the relevant design of the present disclosure to other types of capacitor structures or other processes, various modifications, additions, substitutions, deletions, or other changes may be made to the following specific implementations, but such changes are still within the scope of the principle of the method of forming a capacitor array provided in the present disclosure.

As shown in FIG. 1, in this implementation, the method of forming a capacitor array provided in the present disclosure includes:

Step S1. Provide a substrate, the substrate including an array region and a non-array region, wherein a base layer and a dielectric layer are formed in the substrate, and a first barrier layer is formed between the base layer and the dielectric layer.

Step S2. Form, on a surface of the dielectric layer, a first array definition layer corresponding to the array region and a second array definition layer corresponding to the non-array region.

Step S3. Form a pattern transfer layer on a surface of each of the first array definition layer and the second array definition layer.

Step S4. Pattern the dielectric layer and the second array definition layer by using the pattern transfer layer as a mask, and form a capacitor array located in the array region.

Step S5. Remove the remaining second array definition layer.

Based on the above, in the method of forming a capacitor array provided in the present disclosure, array definition layers respectively corresponding to an array region and a non-array region are formed on a surface of a dielectric layer, and a capacitor array region is predefined by using a difference between etch selectivities of the array definition layers to the dielectric layer. In addition, in the present disclosure, a barrier layer is formed between a base layer and a dielectric layer, such that a capacitor array formed on the dielectric layer can be stopped at the barrier layer. The method of forming a capacitor array provided in the present disclosure can prevent a redundant pattern with a defect from being generated at a position of the capacitor array close to a peripheral circuit region, thereby preventing a capacitor array with a structural defect from being formed on the basis of the redundant pattern, and finally improving a product yield.

FIG. 2 to FIG. 14 respectively and representatively show schematic structural diagrams of semiconductor structures in steps of the method of forming a capacitor array according to the present disclosure. Structures and processes of the semiconductor structures in the steps of the foregoing forming method are described in detail below with reference to the foregoing drawings.

Optionally, as shown in FIG. 2 to FIG. 5, in this implementation, a "forming a first array definition layer 310 and a second array definition layer 320" may specifically include:

forming the first array definition layer 310 on a surface of a dielectric layer 120;

removing the first array definition layer 310 corresponding to a non-array region b; and forming the second array definition layer 320 on the surface of the dielectric layer 120 not covered by the first array definition layer 310, wherein a top surface of the first array definition layer 310 is flush with a top surface of the second array definition layer 320.

Figure 2:
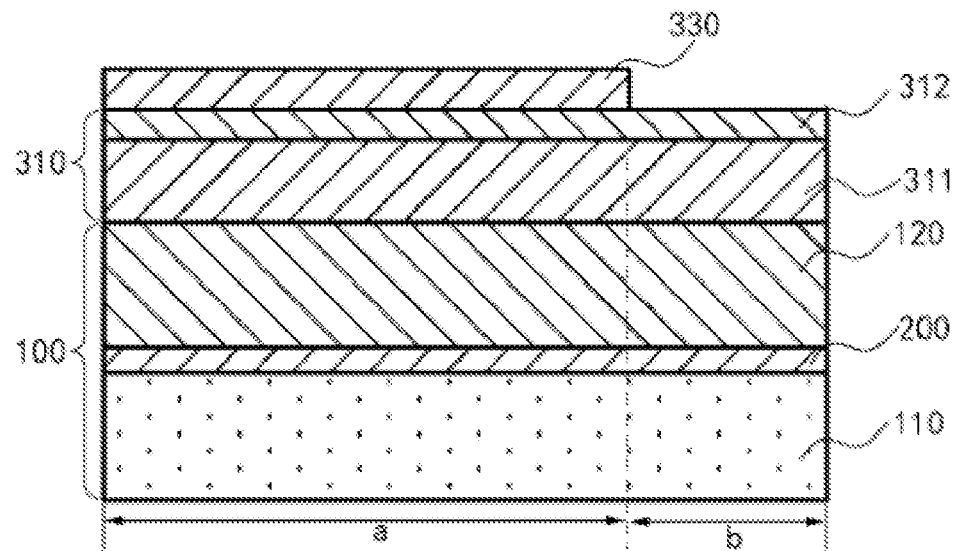
FIG. 2 to FIG. 14 are respectively schematic structural diagrams of semiconductor structures in steps of the method of forming a capacitor array according to the present disclosure.
Figure 3:
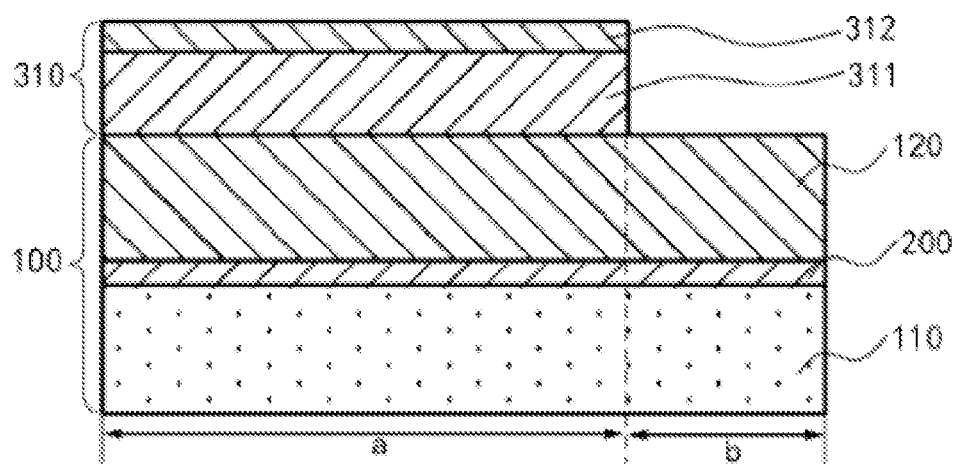

Further, as shown in FIG. 2 and FIG. 3, the "removing the first array definition layer 310 corresponding to a non-array region b" may specifically include:

forming a photomask layer on a surface of the first array definition layer 310; and removing the first array definition layer 310 corresponding to the non-array region b by using a patterned photomask layer as a mask.

It should be noted that, in order to be distinguished from a photomask layer in another step described below, the photomask layer formed on the surface of the first array definition layer 310 is defined as a first photomask layer 330 in this specification. FIG. 2 representatively shows a schematic structural diagram of the semiconductor structure in the "forming the first photomask layer 330 on the surface of the first array definition layer 310". Specifically, in this step, the semiconductor structure includes a substrate 100, the first array definition layer 310, and the patterned first photomask layer 330. A base layer 110 and the dielectric layer 120 are formed in the substrate 100. A first barrier layer 200 is formed between the base layer 110 and the dielectric layer 120, that is, the first barrier layer 200 is formed on a surface of the base layer 110, and the dielectric layer 120 is formed on a surface of the first barrier layer 200. The first array definition layer 310 is formed on the surface of the dielectric layer 120, and a dielectric layer 312 is formed on the surface of the first array definition layer 310. The first photomask layer 330 is formed on a surface of the dielectric layer 312, and a photolithographic opening of the patterned first photomask layer 330 exposes the first array definition layer 310 corresponding to the non-array region b.

Further, in this implementation, in the "forming the dielectric layer 120", a material of the dielectric layer 120 may include silicon oxide ($SiO_2$).

Further, in this implementation, in the "forming the first barrier layer 200", a material of the first barrier layer 200 may include silicon nitride ($Si_3N_4$).

Further, as shown in FIG. 2 to FIG. 5, in this implementation, the "forming the first array definition layer 310", the first array definition layer 310 includes an amorphous carbon layer 311 and the dielectric layer 312. The amorphous carbon layer 311 is formed on the surface of the dielectric layer 120, and the dielectric layer 312 is formed on a surface of the amorphous carbon layer 311. Based on this, in the "forming the first photomask layer 330", the first photomask layer 330 is specifically formed on the surface of the dielectric layer 312, in the "removing the first array definition layer 310 corresponding to the non-array region b", the amorphous carbon layer 311 corresponding to the non-array region b and the dielectric layer 312 corresponding to the non-array region b are specifically removed, and in the "forming the second array definition layer 320", the top surface of the second array definition layer 320 is flush with a top surface of the dielectric layer 312.

Further, in this implementation, in the "forming the amorphous carbon layer 311", the amorphous carbon layer 311 may be formed on the dielectric layer 120 through a spin coating process.

Further, in this implementation, in the "forming the dielectric layer 312", the dielectric layer 312 may be a silicon oxynitride film layer, that is, a material thereof includes silicon oxynitride (SiON).

FIG. 3 representatively shows a schematic structural diagram of the semiconductor structure in the "removing the first array definition layer 310 corresponding to the non-array region b". Specifically, in this step, the semiconductor structure includes the substrate 100 and the remaining first array definition layer 310. In the foregoing etching process, the first array definition layer 310 not covered by the first photomask layer 330 (that is, the first array definition layer 310 corresponding to the non-array region b) is removed by using the patterned first photomask layer 330 as a mask, and the remaining first photomask layer 330 is also removed, to expose the dielectric layer 120 located in the non-array region b.

Further, in the "removing the first array definition layer 310 corresponding to the non-array region b", the first array definition layer 310 specifically may be removed partially through a dry etching process.

Figure 4:
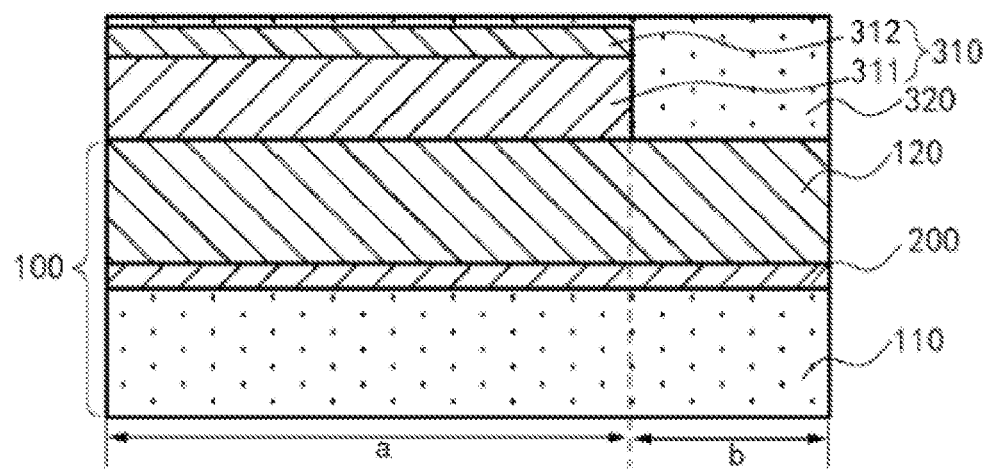
Figure 5:
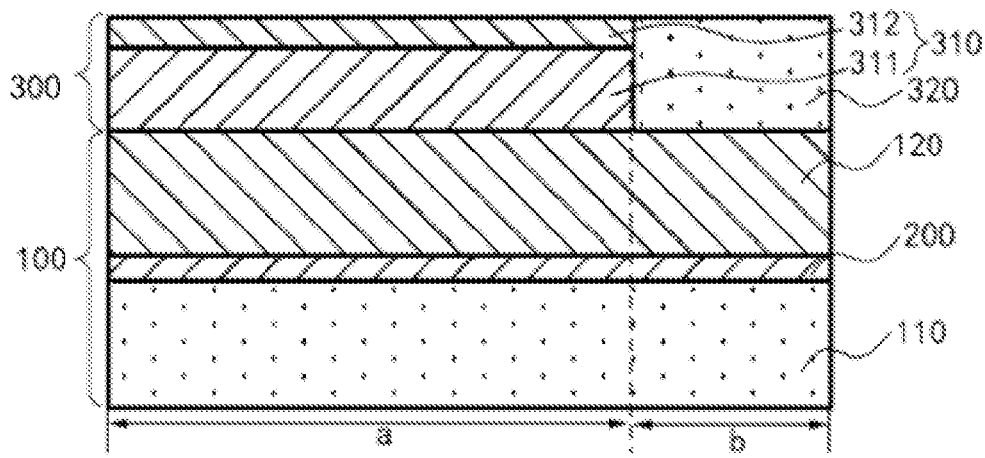

Further, as shown in FIG. 4 and FIG. 5, the "forming the second array definition layer 320" may specifically include:

forming the second array definition layer 320, wherein the second array definition layer 320 covers the first array definition layer 310 and the dielectric layer 120 located in the non-array region b; and removing the second array definition layer 320 located on the first array definition layer 310, and exposing the top surface of the first array definition layer 310.

FIG. 4 representatively shows a schematic structural diagram of the semiconductor structure in the "forming the second array definition layer 320". Specifically, in this step, the semiconductor structure includes the substrate 100, the remaining first array definition layer 310, and the second array definition layer 320. The second array definition layer 320 covers the exposed surface of the dielectric layer 120 and the surface of the first array definition layer 310. Further, in this implementation, in the "forming the second array definition layer 320", the second array definition layer 320 may be a polycrystalline silicon layer.

FIG. 5 representatively shows a schematic structural diagram of the semiconductor structure in the "removing a part of the top of the second array definition layer 320". Specifically, in this step, the semiconductor structure includes the substrate 100, the remaining first array definition layer 310, and the remaining second array definition layer 320. The second array definition layer 320 located on the first array definition layer 310 is partially removed, to expose the top surface of the remaining first array definition layer 310 (that is, the top surface of the remaining dielectric layer 312), and the top surface of the remaining second array definition layer 320 is flush with the top surface of the remaining first array definition layer 310. Based on this, the remaining first array definition layer 310 and the remaining second array definition layer 320 jointly define an array definition layer 300.

Further, in the "removing the second array definition layer 320 located on the first array definition layer 310", the second array definition layer 320 located on the first array definition layer 310 may be specifically removed through a chemical mechanical polishing process. In other implementations, alternatively, the second array definition layer 320 may be removed through a dry etching process or other processes, which is not limited to this implementation.

Figure 7:
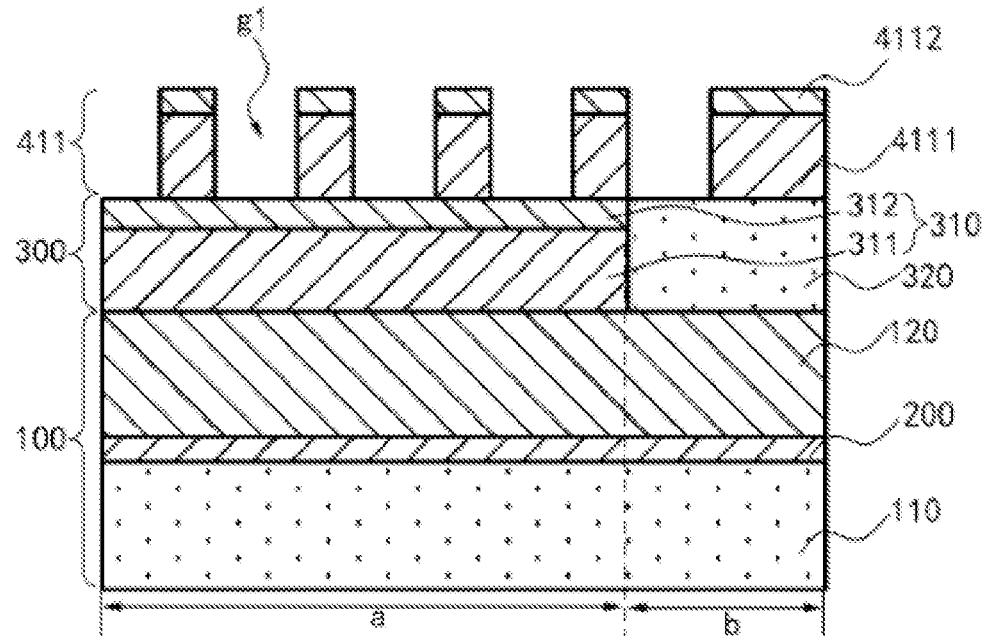
Figure 10:
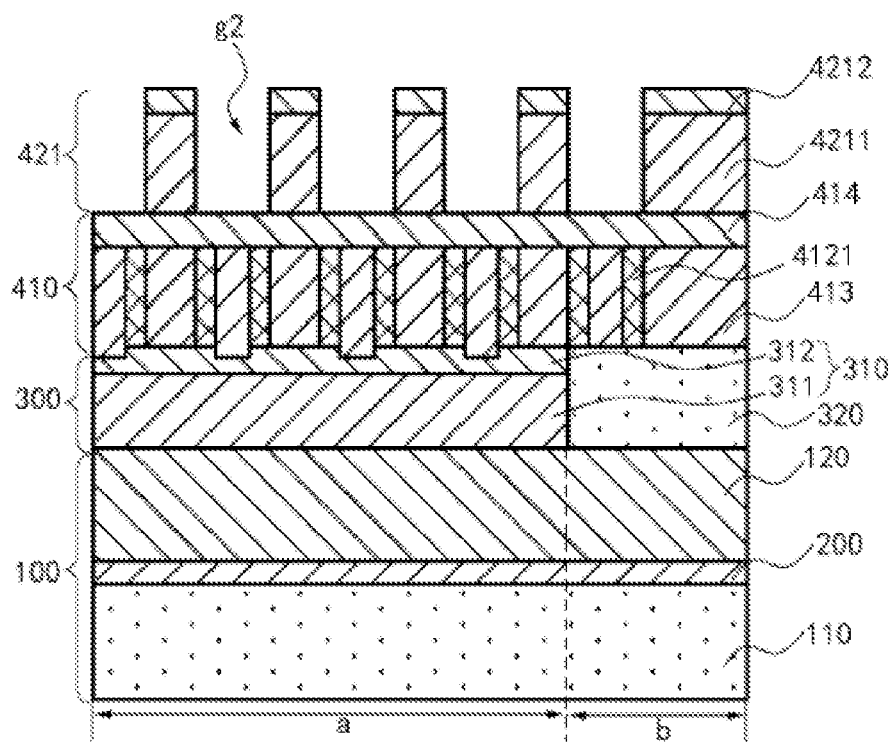
Figure 12:
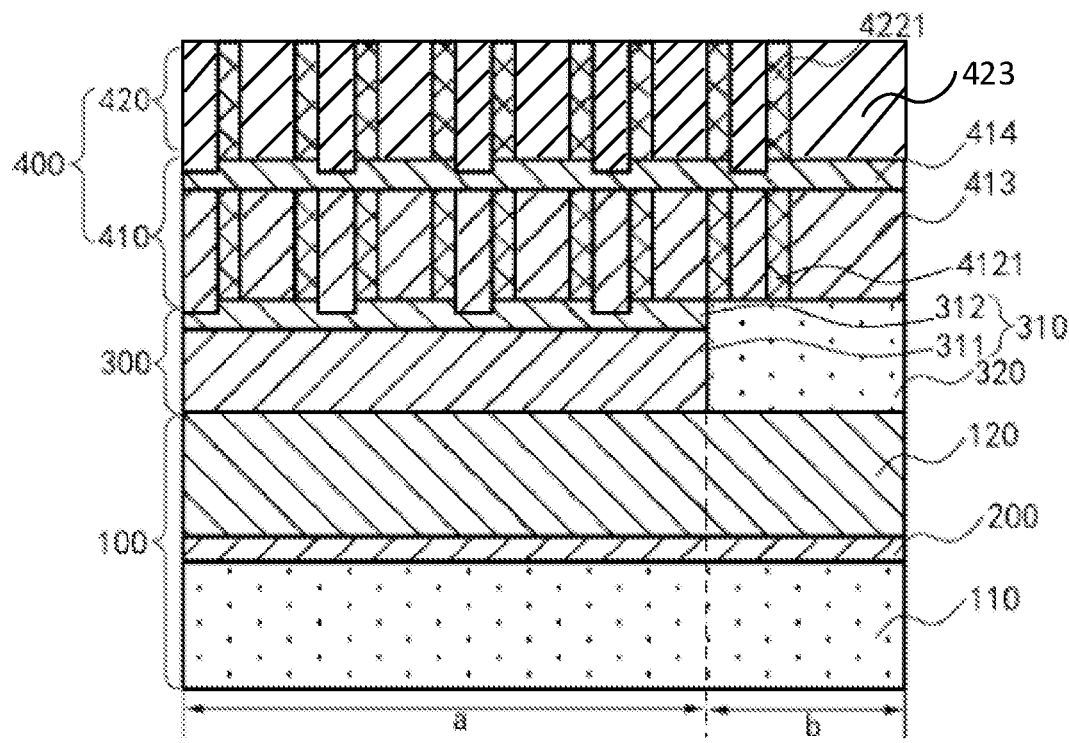

Optionally, in this implementation, a "forming a pattern transfer layer 400" may specifically include:

as shown in FIG. 7 and FIG. 10, forming, on the surface of each of the first array definition layer 310 and the second array definition layer 320, a first pattern transfer layer 410, the first pattern transfer layer 410 having a plurality of first hard masks 4121, wherein the first hard masks 4121 extend along a first direction and are spaced apart from each other;

as shown in FIG. 10 and FIG. 12, forming a barrier layer on a surface of the first pattern transfer layer 410; and forming, on a surface of the barrier layer, a second pattern transfer layer 420, the second pattern transfer layer 420 having a plurality of second hard masks 4221, wherein the second hard masks 4221 extend along a second direction and are spaced apart from each other, wherein the first hard masks 4121 and the second hard masks 4221 jointly constitute patterns of the pattern transfer layer 400.

It should be noted that, in order to be distinguished from a barrier layer in another step, the barrier layer formed on the surface of the first pattern transfer layer 410 is defined as a second barrier layer 414 in this specification.

Figure 6:
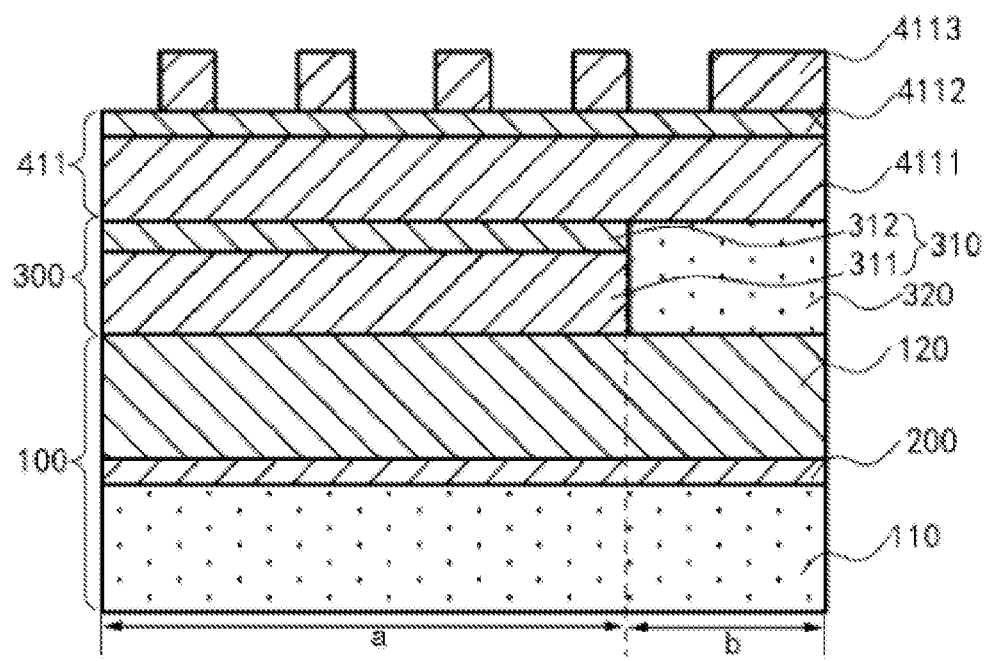
Figure 8:
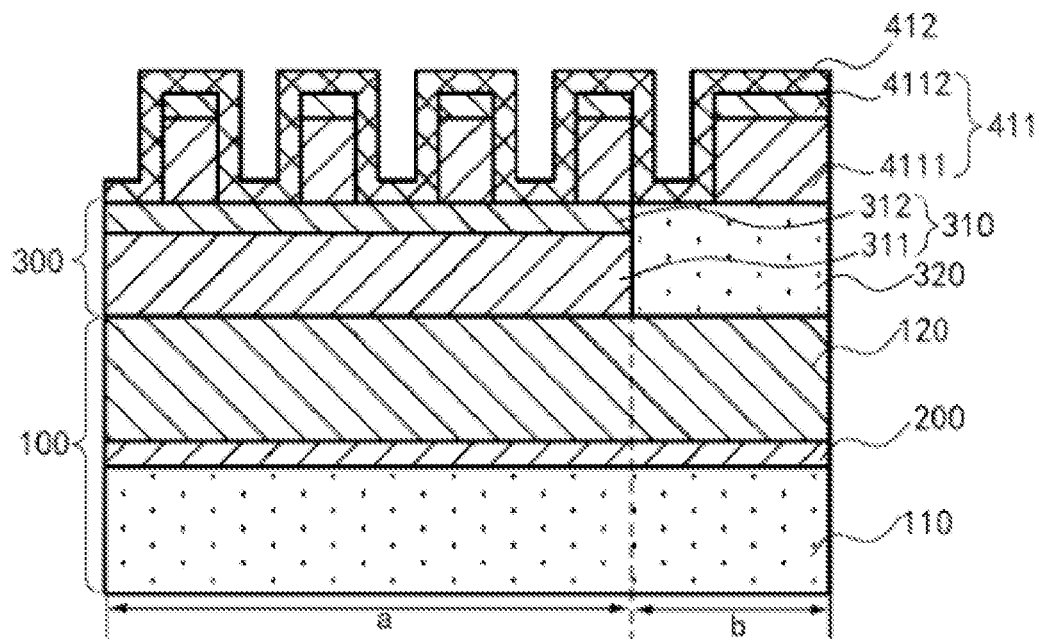
Figure 9:
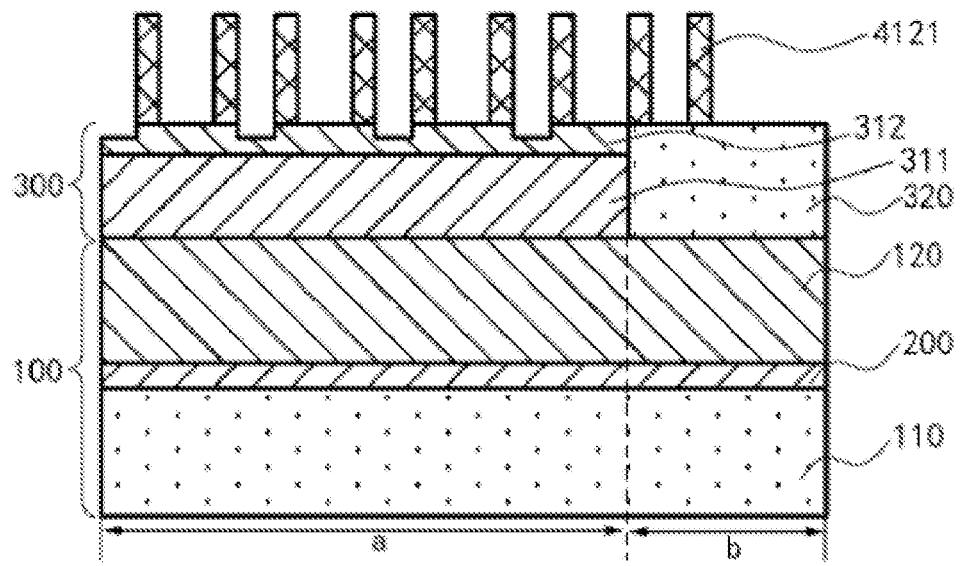

Further, the "forming first hard masks 4121" may specifically include:

as shown in FIG. 6, forming a first mask layer 411 on a surface of the array definition layer 300;

as shown in FIG. 7, removing a part of the first mask layer 411, and forming first trenches g1;

as shown in FIG. 8, forming a first sacrificial layer 412, wherein the first sacrificial layer 412 covers the bottoms of the first trenches g1 and the remaining first mask layer 411; and as shown in FIG. 9, removing the first sacrificial layer 412 on the top of the first mask layer 411 and the first sacrificial layer 412 at the bottoms of the first trenches g1, removing the remaining first mask layer 411, and forming the first hard masks 4121.

Further, as shown in FIG. 6, the "removing a part of the first mask layer 411" may specifically include:

forming a photomask layer on a surface of the first mask layer 411; and removing a part of the first mask layer 411 by using a patterned photomask layer as a mask, and forming the first trenches g1.

It should be noted that, in order to be distinguished from a photomask layer in another step, the photomask layer formed on the first mask layer 411 is defined as a second photomask layer 4113 in this specification.

FIG. 6 representatively shows a schematic structural diagram of the semiconductor structure in the "forming a first mask layer 411" and "forming a second photomask layer 4113 on a surface of the first mask layer 411". Specifically, in this step, the semiconductor structure includes the substrate 100, the first barrier layer 200, the array definition layer 300, the first mask layer 411, and the patterned second photomask layer 4113. The first mask layer 411 is formed on the surface of the array definition layer 300. The second photomask layer 4113 is formed on the surface of the first mask layer 411.

Further, as shown in FIG. 6, in this implementation, the first mask layer 411 may include a first sub-mask layer 4111 and a second sub-mask layer 4112. The first sub-mask layer 4111 is formed on the surface of the array definition layer 300, and the second sub-mask layer 4112 is formed on a surface of the first sub-mask layer 4111. Based on this, in the "forming a second photomask layer 4113", the second photomask layer 4113 is specifically formed on a surface of the second sub-mask layer 4112.

Further, in this implementation, in the "forming a first mask layer 411", the first sub-mask layer 4111 may be formed through a spin coating process.

Further, in this implementation, in the "forming a first mask layer 411", the second sub-mask layer 4112 may be formed through a deposition process.

Further, in this implementation, in the "forming a first mask layer 411", the first sub-mask layer 4111 may be a silicon oxycarbide film layer, that is, a material thereof includes silicon oxycarbide (SOC).

Further, in this implementation, in the "forming a first mask layer 411", the second sub-mask layer 4112 may be a silicon oxynitride film layer, that is, a material thereof includes silicon oxynitride.

FIG. 7 representatively shows a schematic structural diagram of the semiconductor structure in the "removing a part of the first mask layer 411". Specifically, in this step, the semiconductor structure includes the substrate 100, the first barrier layer 200, the array definition layer 300, and the remaining first mask layer 411. In the foregoing etching process, a part of the first mask layer 411 not covered by the second photomask layer 4113 is removed by using the patterned second photomask layer 4113 as a mask, and the remaining second photomask layer 4113 is also removed, to form the first trenches g1 in the first mask layer 411.

Further, in this implementation, in the "removing a part of the first mask layer 411", a part of the first mask layer 411 may be removed through a dry etching process.

FIG. 8 representatively shows a schematic structural diagram of the semiconductor structure in the "forming a first sacrificial layer 412". Specifically, in this step, the semiconductor structure includes the substrate 100, the first barrier layer 200, the array definition layer 300, the remaining first mask layer 411, and the first sacrificial layer 412. The first sacrificial layer 412 covers the bottoms of the first trenches g1, and also covers the remaining first mask layer 411.

Further, in this implementation, in the "forming a first sacrificial layer 412", the first sacrificial layer 412 may be formed through an atomic layer deposition process.

Further, in this implementation, in the "forming a first sacrificial layer 412", a material of the first sacrificial layer 412 may include silicon oxide ($SiO_2$).

FIG. 9 representatively shows a schematic structural diagram of the semiconductor structure in the "removing a part of the first sacrificial layer 412 and the remaining first mask layer 411". Specifically, in this step, the semiconductor structure includes the substrate 100, the first barrier layer 200, the array definition layer 300, and the remaining first sacrificial layer 412. The remaining first sacrificial layer 412 forms a plurality of first hard masks 4121 spaced apart from each other and extending along the first direction.

Further, in this implementation, in the "forming the first hard masks 4121", the first sacrificial layer 412 on the top of the first mask layer 411 and the first sacrificial layer 412 at the bottoms of the first trenches g1 may be removed through a dry etching process, and the remaining first mask layer 411 is removed.

Figure 11:
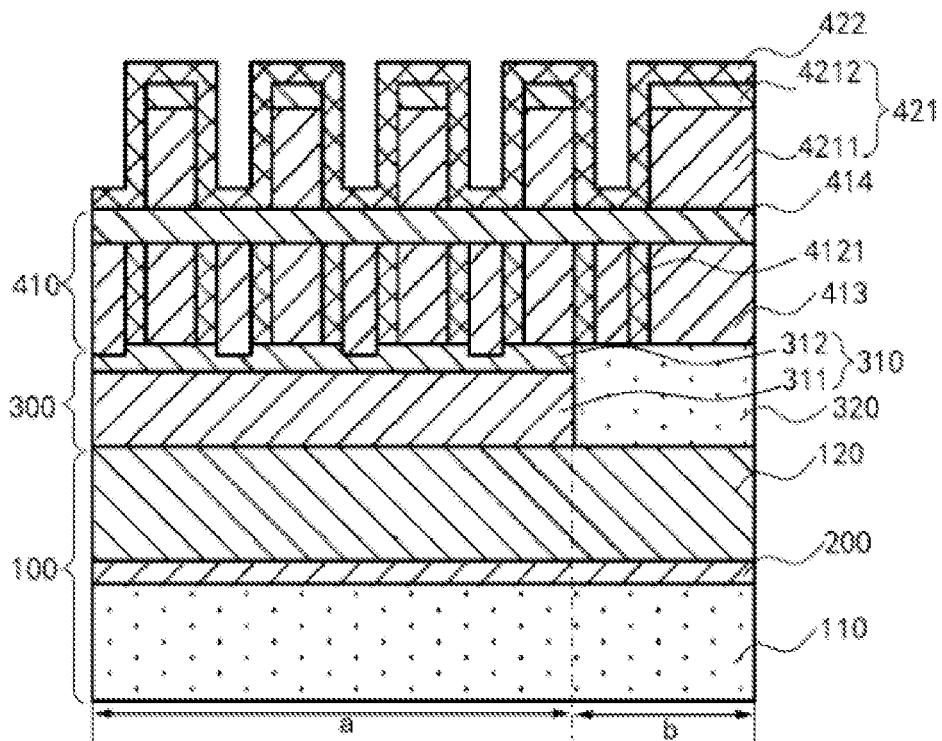

Further, the "forming second hard masks 4221" may specifically include:

as shown in FIG. 10, forming a second mask layer 421 on the surface of the first pattern transfer layer 410;

removing a part of the second mask layer 421, and forming second trenches g2;

as shown in FIG. 11, forming a second sacrificial layer 422, wherein the second sacrificial layer 422 covers the bottoms of the second trenches g2 and the remaining second mask layer 421; and as shown in FIG. 12, removing the second sacrificial layer 422 on the top of the second mask layer 421 and the second sacrificial layer 422 at the bottoms of the second trenches g2, removing the remaining second mask layer 421, and forming the second hard masks 4221.

Further, the "removing a part of the second mask layer 421" may specifically include:

forming a photomask layer on a surface of the second mask layer 421; and removing a part of the second mask layer 421 by using a patterned photomask layer as a mask, and forming the second trenches g2.

Further, as shown in FIG. 10, before the "forming a second barrier layer 414", the following step may be further included:

inserting a first buffer layer 413 between adjacent first hard masks 4121, wherein a top surface of the first buffer layer 413 is flush with the top surface of each of the first hard masks 4121.

Based on this, the second barrier layer 414 is formed on the surface of each of the first buffer layer 413 and the first hard masks 4121.

Further, after the "forming a second pattern transfer layer 420 having a plurality of second hard masks 4221", the following step may be further included:

inserting a second buffer layer 423 between adjacent second hard masks 4221, wherein a top surface of the second buffer layer 423 is flush with the top surface of each of the second hard masks 4221.

FIG. 10 representatively shows a schematic structural diagram of the semiconductor structure in the "forming a second mask layer 421" and "removing a part of the second mask layer 421 and forming second trenches g2". Specifically, in this step, the semiconductor structure includes the substrate 100, the first barrier layer 200, the array definition layer 300, the first pattern transfer layer 410, and the remaining second mask layer 421. The first pattern transfer layer 410 may be construed as including the first hard masks 4121 (that is, the remaining first sacrificial layer 412), the first buffer layer 413, and the second barrier layer 414. The second mask layer 421 includes a third sub-mask layer 4211 and a fourth sub-mask layer 4212 that are laminated, that is, the third sub-mask layer 4211 is formed on the surface of the first pattern transfer layer 410 (that is, the surface of the second barrier layer 414), and the fourth sub-mask layer 4212 is formed on a surface of the third sub-mask layer 4211. In addition, the photomask layer may be formed on the surface of the second mask layer 421 (that is, the surface of the fourth sub-mask layer 4212), and a part of the second mask layer 421 may be removed by using the patterned photomask layer as a mask, to form the second trenches g2.

For the specific etching process, reference may be made to the formation of the first trenches g1, and details are not described herein again.

Further, in this implementation, in the "forming a first buffer layer 413", a material of the first buffer layer 413 may include silicon oxycarbide.

Further, in this implementation, in the "forming a second barrier layer 414", the second barrier layer 414 may be a silicon oxynitride film layer, that is, a material thereof includes silicon oxynitride.

Further, in this implementation, in the "forming a second mask layer 421", the third sub-mask layer 4211 may be formed through a spin coating process.

Further, in this implementation, in the "forming a second mask layer 421", the fourth sub-mask layer 4212 may be formed through a deposition process.

Further, in this implementation, in the "forming a second mask layer 421", the third sub-mask layer 4211 may be a silicon oxycarbide film layer, that is, a material thereof includes silicon oxycarbide.

Further, in this implementation, in the "forming a second mask layer 421", the fourth sub-mask layer 4212 may be a silicon oxynitride film layer, that is, a material thereof includes silicon oxynitride.

Further, in this implementation, in the "removing a part of a second mask layer 421", a part of the second mask layer 421 may be removed through a dry etching process.

FIG. 11 representatively shows a schematic structural diagram of the semiconductor structure in the "forming a second sacrificial layer 422". Specifically, in this step, the semiconductor structure includes the substrate 100, the first barrier layer 200, the array definition layer 300, the first pattern transfer layer 410, the remaining second mask layer 421, and the second sacrificial layer 422. The second sacrificial layer 422 covers the remaining second mask layer 421, and also covers the bottoms of the second trenches g2.

Further, in this implementation, in the "forming a second sacrificial layer 422", the second sacrificial layer 422 may be formed through an atomic layer deposition process.

Further, in this implementation, in the "forming a second sacrificial layer 422", a material of the second sacrificial layer 422 may include silicon oxide ($SiO_2$).

FIG. 12 representatively shows a schematic structural diagram of the semiconductor structure in the "removing a part of the second sacrificial layer 422 and the remaining second mask layer 421". Specifically, in this step, the semiconductor structure includes the substrate 100, the first barrier layer 200, the array definition layer 300, the first pattern transfer layer 410, and the remaining second sacrificial layer 422. The remaining second sacrificial layer 422 forms a plurality of second hard masks 4221 spaced apart from each other and extending along the second direction. Based on this, in the present disclosure, the pattern transfer layer 400 including the first pattern transfer layer 410 and the second pattern transfer layer 420 are formed on the surface of the array definition layer 300 through the foregoing optimized thin film stack process, the first pattern transfer layer 410 includes a plurality of first hard masks 4121, and the second pattern transfer layer includes a plurality of second hard masks 4221.

Further, in this implementation, in the "forming second hard masks 4221", the second sacrificial layer 422 on the top of the second mask layer 421 and the second sacrificial layer 422 at the bottoms of the second trenches g2 may be removed through a dry etching process, the remaining second mask layer 421 is removed, and the remaining second sacrificial layer 422 forms the plurality of second hard masks 4221 extending along the second direction and spaced apart from each other.

Figure 13:
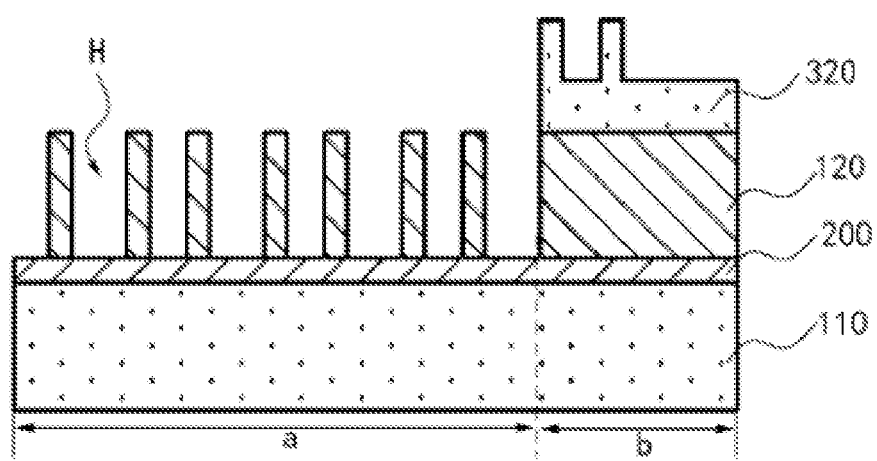

FIG. 13 representatively shows a schematic structural diagram of the semiconductor structure in the "patterning the dielectric layer 120 and the second array definition layer 320 by using the pattern transfer layer 400 as a mask". Specifically, in this step, the semiconductor structure includes the base layer 110, the first barrier layer 200, the remaining dielectric layer 120, and the remaining second array definition layer 320. Patterns of the pattern transfer layer 400 that correspond to the array region a are transferred to the dielectric layer 120, such that capacitor holes H, that is, a capacitor array of the semiconductor structure, located in the array region a are formed in the dielectric layer 120. Patterns of the pattern transfer layer 400 that corresponding to the non-array region b are transferred to the second array definition layer 320. Further, in this implementation, in the "patterning the dielectric layer 120 and the second array definition layer 320", the dielectric layer 120 and the second array definition layer 320 may be specifically patterned through a dry etching process, and bottom surfaces of the capacitor holes H are defined by using the surface of the first barrier layer 200.

Figure 14:
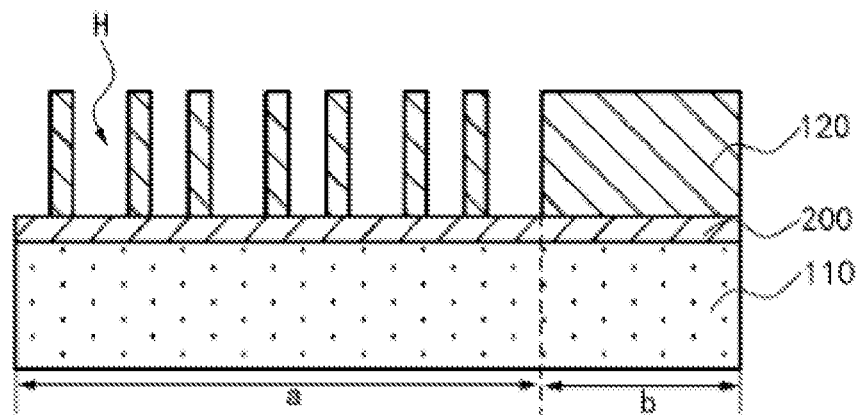

FIG. 14 representatively shows a schematic structural diagram of the semiconductor structure in the "removing the remaining second array definition layer 320". Specifically, in this step, the semiconductor structure includes the base layer 110, the first barrier layer 200, and the dielectric layer 120 on which the capacitor array is formed. The remaining second array definition layer 320 may be specifically removed through a dry etching process.

Further, in this implementation, an etch selectivity of the dielectric layer 120 to the second array definition layer 320 may be greater than 10:1, to form structurally complete capacitor holes.

Figure 15:
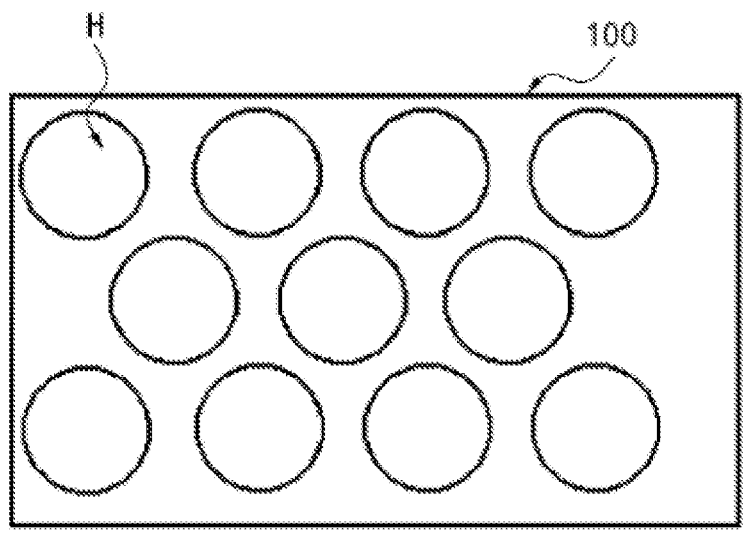
FIG. 15 is a plan view of the semiconductor structure in the step shown in FIG. 14.

In this way, according to the method of forming a capacitor array provided in the present disclosure, the semiconductor structure forms the capacitor array, and as shown in FIG. 15, there is no redundant pattern with a defect at a position of the capacitor array of the semiconductor structure close to a peripheral circuit region. The present disclosure can prevent a redundant pattern with a defect from being generated at a position of the capacitor array close to a peripheral circuit region, thereby preventing a capacitor array with a structural defect from being formed on the basis of the redundant pattern, and finally improving a product yield.

Based on the foregoing detailed description of the exemplary implementations of the method of forming a capacitor array provided in the present disclosure, an exemplary implementation of the semiconductor structure provided in the present disclosure is described below.

In this implementation, the semiconductor structure provided in the present disclosure includes a capacitor array, and the capacitor array of the semiconductor structure is formed by using the method of forming a capacitor array described in detail in the foregoing implementations and provided in the present disclosure.

In summary, in the method of forming a capacitor array provided in the present disclosure, array definition layers respectively corresponding to an array region and a non-array region are formed on a surface of a dielectric layer, and a capacitor array region is predefined by using a difference between etch selectivities of the array definition layers to the dielectric layer. In addition, in the present disclosure, a barrier layer is formed between a base layer and a dielectric layer, such that a capacitor array formed on the dielectric layer can be stopped at the barrier layer. The method of forming a capacitor array provided in the present disclosure can prevent a redundant pattern with a defect from being generated at a position of the capacitor array close to a peripheral circuit region, thereby preventing a capacitor array with a structural defect from being formed on the basis of the redundant pattern, and finally improving a product yield.

The present disclosure is described above with reference to several typical implementations. It should be understood that the terms used herein are illustrative and exemplary, rather than limiting. The present disclosure may be specifically implemented in many forms without departing from the spirit or essence of the present disclosure. Therefore, it should be understood that the above embodiments are not limited to any of the above-mentioned details, but should be broadly interpreted according to the spirit and scope defined by the appended claims. Therefore, any changes and modifications falling within the claims or the equivalent scope thereof should be covered by the appended claims.

The invention claimed is:

1. A method of forming a capacitor array, comprising:
providing a substrate, the substrate comprising an array region and a non-array region, wherein a base layer and a dielectric layer are formed in the substrate, and a first barrier layer is formed between the base layer and the dielectric layer;
forming, on a surface of the dielectric layer, a first array definition layer and a second array definition layer respectively corresponding to the array region and the non-array region;
forming a pattern transfer layer on a surface of each of the first array definition layer and the second array definition layer;
patterning the dielectric layer and the second array definition layer by using the pattern transfer layer as a mask, and forming a capacitor array located in the array region; and
removing a remaining second array definition layer.

2. The method of forming a capacitor array according to claim 1, wherein the forming a first array definition layer and a second array definition layer comprises:
forming the first array definition layer on the surface of the dielectric layer;
removing the first array definition layer corresponding to the non-array region; and
forming the second array definition layer on the surface of the dielectric layer not covered by the first array definition layer, wherein a top surface of the first array definition layer is flush with a top surface of the second array definition layer.

3. The method of forming a capacitor array according to claim 2, wherein the removing the first array definition layer corresponding to the non-array region comprises:
forming a photomask layer on the surface of the first array definition layer; and
removing the first array definition layer corresponding to the non-array region by using a patterned photomask layer as a mask.

4. The method of forming a capacitor array according to claim 2, wherein the forming the second array definition layer on the surface of the dielectric layer comprises:
forming the second array definition layer, wherein the second array definition layer covers the first array definition layer and the dielectric layer located in the non-array region; and removing the second array definition layer located on the first array definition layer, to expose the top surface of the first array definition layer.

5. The method of forming a capacitor array according to claim 4, wherein the removing the second array definition layer located on the first array definition layer comprises:
removing the second array definition layer located on the first array definition layer by using a chemical mechanical polishing process or a dry etching process.

6. The method of forming a capacitor array according to claim 1, wherein the forming a pattern transfer layer comprises:
forming, on the surface of each of the first array definition layer and the second array definition layer, a first pattern transfer layer, the first pattern transfer layer having a plurality of first hard masks, wherein the first hard masks extend along a first direction and are spaced apart from each other;
forming a second barrier layer on a surface of the first pattern transfer layer; and
forming, on a surface of the second barrier layer, a second pattern transfer layer, the second pattern transfer layer having a plurality of second hard masks, wherein the second hard masks extend along a second direction and are spaced apart from each other, wherein
the first hard masks and the second hard masks jointly constitute patterns of the pattern transfer layer.

7. The method of forming a capacitor array according to claim 6, wherein before the forming a second barrier layer on a surface of the first pattern transfer layer, the method further comprises inserting a first buffer layer between adjacent first hard masks.

8. The method of forming a capacitor array according to claim 6, wherein the forming, on a surface of the second barrier layer, a second pattern transfer layer, the second pattern transfer layer having a plurality of second hard masks comprises inserting a second buffer layer between adjacent second hard masks.

9. The method of forming a capacitor array according to claim 6, wherein forming the first hard masks, the first hard masks extending along the first direction comprises:
forming a first mask layer on the surface of each of the first array definition layer and the second array definition layer;
removing a part of the first mask layer, and forming first trenches;
forming a first sacrificial layer, wherein the first sacrificial layer covers bottoms of the first trenches and a remaining first mask layer; and
removing the first sacrificial layer on a top of the first mask layer and the first sacrificial layer at the bottoms of the first trenches, removing the remaining first mask layer, and forming the first hard masks.

10. The method of forming a capacitor array according to claim 9, wherein the removing a part of the first mask layer comprises:

forming a photomask layer on a surface of the first mask layer; and
removing a part of the first mask layer by using a patterned photomask layer as a mask, and forming the first trenches.

11. The method of forming a capacitor array according to claim 9, wherein the forming a first mask layer comprises:
spin coating the surface of each of the first array definition layer and the second array definition layer, and forming a first sub-mask layer; and
depositing and forming a second sub-mask layer on a surface of the first sub-mask layer, wherein
the first sub-mask layer and the second sub-mask layer jointly constitute the first mask layer.

12. The method of forming a capacitor array according to claim 6, wherein forming the second hard masks, the second hard masks extending along the second direction comprises:
forming a second mask layer on the surface of the first pattern transfer layer;
removing a part of the second mask layer, and forming second trenches;
forming a second sacrificial layer, wherein the second sacrificial layer covers bottoms of the second trenches and a remaining second mask layer; and
removing the second sacrificial layer on a top of the second mask layer and the second sacrificial layer at the bottoms of the second trenches, removing the remaining second mask layer, and forming the second hard masks.

13. The method of forming a capacitor array according to claim 12, wherein the removing a part of the second mask layer comprises:
forming a photomask layer on a surface of the second mask layer; and
removing a part of the second mask layer by using a patterned photomask layer as a mask, and forming the second trenches.

14. The method of forming a capacitor array according to claim 12, wherein the forming a second mask layer comprises:
spin coating the surface of the second barrier layer, and forming a third sub-mask layer; and
depositing and forming a fourth sub-mask layer on a surface of the third sub-mask layer, wherein
the third sub-mask layer and the fourth sub-mask layer jointly constitute the second mask layer.

15. The method of forming a capacitor array according to claim 1, wherein an etch selectivity of the dielectric layer to the second array definition layer is greater than 10:1.

16. A semiconductor structure, wherein a capacitor array of the semiconductor structure is formed by using the method of forming a capacitor array according to claim 1.

* * * * *